(12) United States Patent
Dela Cruz et al.

(10) Patent No.: US 7,522,401 B2
(45) Date of Patent: Apr. 21, 2009

(54) STATIC DISSIPATIVE LAYER SYSTEM AND METHOD

(75) Inventors: Warly A. Dela Cruz, Sta. Rosa (PH); Charlene T. Hintay, Cavite (PH); Jeffrey D. Concordia, Las Pinas (PH)

(73) Assignee: Intel Corporation, Santa Clara, CA (US)

( * ) Notice: Subject to any disclaimer, the term of this patent is extended or adjusted under 35 U.S.C. 154(b) by 357 days.

(21) Appl. No.: 11/441,579

(22) Filed: May 26, 2006

(65) Prior Publication Data

US 2007/0274018 A1 Nov. 29, 2007

(51) Int. Cl.
*H02H 1/00* (2006.01)
(52) U.S. Cl. ...................... 361/220; 361/212
(58) Field of Classification Search ............ 361/56, 361/111, 212, 220; 324/754, 761; 438/14, 438/15
See application file for complete search history.

(56) References Cited

U.S. PATENT DOCUMENTS 5,663,655 A * 9/1997 Johnston et al. ............. 324/761
6,541,988 B2 * 4/2003 Dangelmayer et al. ....... 324/754
6,958,616 B1 * 10/2005 Mahoney et al. ............. 324/754
2006/0024986 A1 * 2/2006 Rafter et al. ................. 439/66

* cited by examiner

*Primary Examiner*—Danny Nguyen
(74) *Attorney, Agent, or Firm*—Schwabe, Williamson & Wyatt, P.C.

(57) ABSTRACT

An apparatus, system, and method is provided including a plurality of test pins, a static dissipative layer having a plurality of openings, and a plurality of support features coupled to the static dissipative layer to movably support the static dissipative layer at a first and a second relative position. The support features enable the static dissipative layer to make initial contact with terminals of a component to be tested to discharge static, if any, built up at the terminals of the component while the static dissipative layer is supported at the first relative position. The support features also enable the static dissipative layer to expose the test pins through the openings to make contact with the terminals of the component after the static dissipative layer had made initial contact with the terminals of the component at the first relative position.

29 Claims, 5 Drawing Sheets

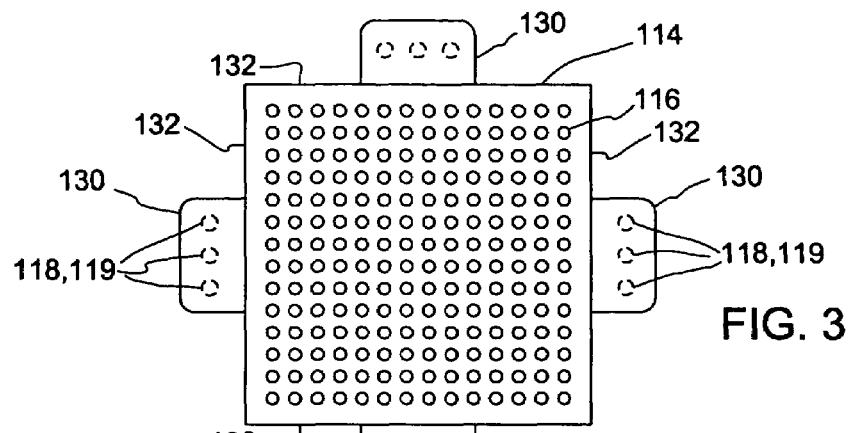
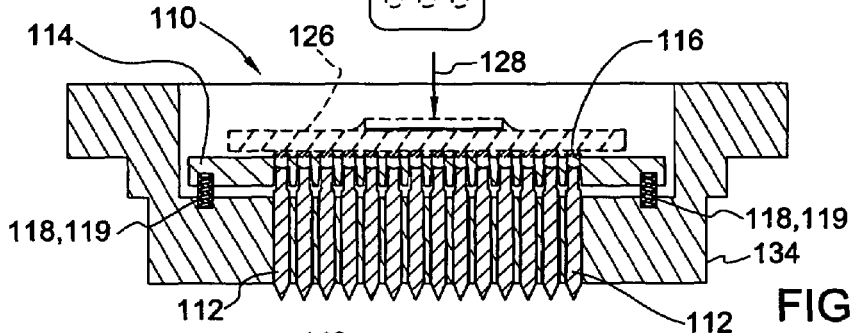
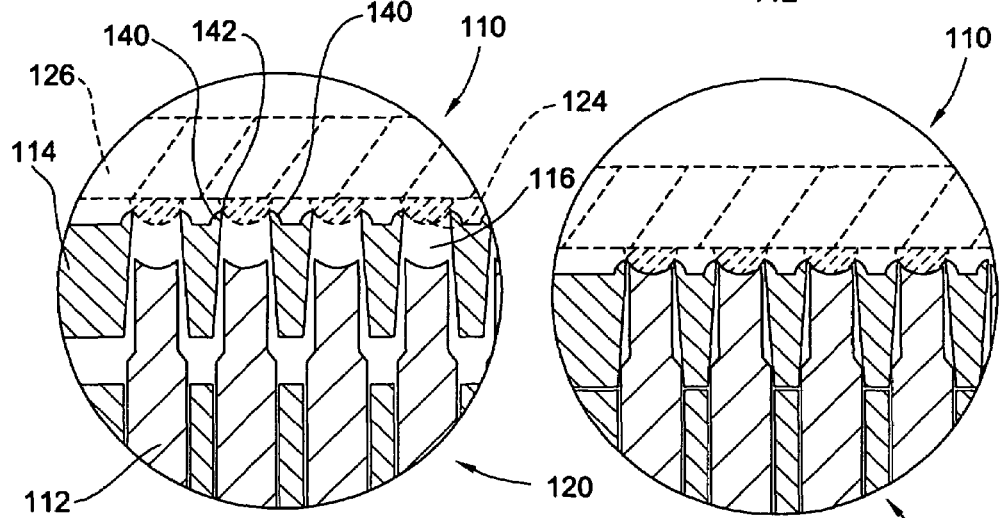

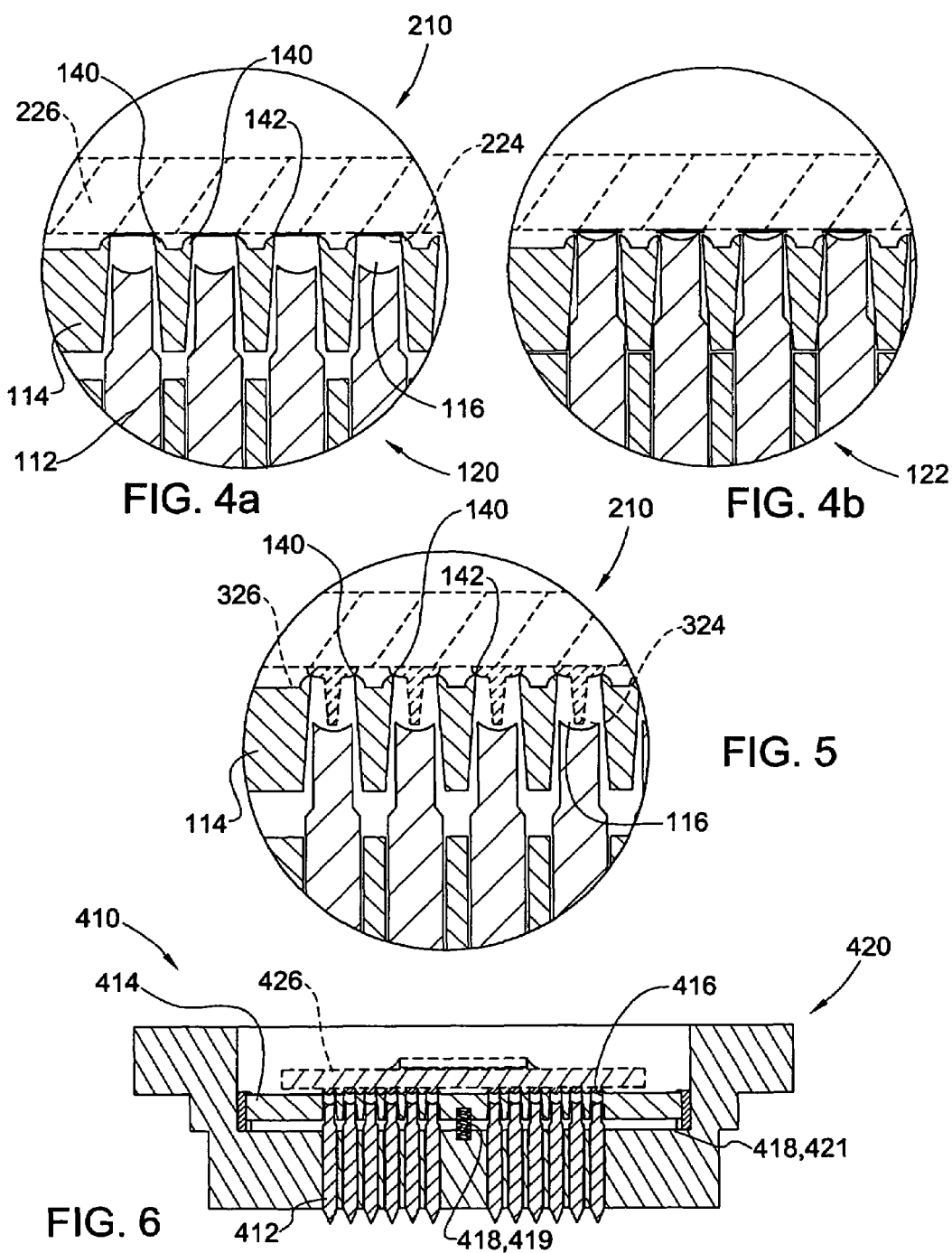

STATIC DISSIPATIVE LAYER SYSTEM AND METHOD

TECHNICAL FIELD

Embodiments of the present invention relate to the field of electrical component testing, and more specifically, to a static dissipative layer (SDL) that can be used with an electrical component testing apparatus, a method and a system.

BACKGROUND

Charges can be generated and can accumulate on a component, or a device under test (DUT), from sources such as the nozzles, suction cups, or pick-up mechanisms, on automatic handling equipment used to move the DUTs. Abrupt or rapid electrical discharge may be referred to as an electrostatic discharge (ESD) event, and may occur when the charged DUT contacts the test pins in the test interface unit (TIU). Persistent, or singular, ESD events can cause catastrophic and/or latent failures of the DUT. ESD events can also negatively impact the quality and reliability of the device.

As the number of terminals on electrical components increases, the number of, and the severity of, ESD events typically increases. As components get more complex the number of terminals typically increases.

Proposed solutions to this problem include installing air ionizers in the testing environment, or using test pins with retractable static dissipative caps. However, each of these proposed solutions have problems. ESD events may happen so quickly that it is typically not possible for ionizers to completely neutralize a charge that may have accumulated on the device to be tested. Static dissipative test pins are expensive.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 2a is a cross sectional view illustrating an apparatus in accordance with various embodiments of the present invention;

FIG. 2b is a detailed cross sectional view of the embodiment shown in FIG. 2a illustrating the apparatus in a first relative position;

FIG. 2c is a detailed cross sectional view of the embodiment shown in FIG. 2a illustrating the apparatus in a second relative position;

FIG. 3 is a top view of the static dissipative layer 114 illustrated in FIG. 2a;

FIG. 4a is a detailed cross sectional view illustrating an apparatus in accordance with various embodiments of the present invention in a first relative position;

FIG. 4b is a detailed cross sectional view illustrating the apparatus illustrated in FIG. 4a in a second relative position;

FIG. 5 is a detailed cross sectional view illustrating an apparatus in accordance with various embodiments of the present invention;

FIG. 6 is a cross sectional view illustrating an apparatus in accordance with various embodiments of the present invention;

DETAILED DESCRIPTION OF ILLUSTRATIVE EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Figure 1A:
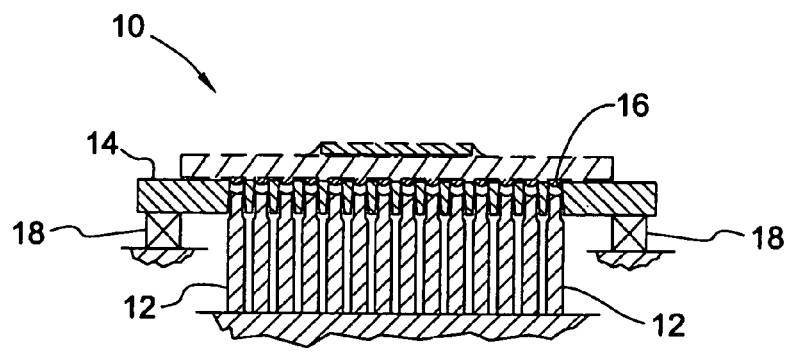
FIG. 1a is a cross sectional view illustrating an apparatus in accordance with various embodiments of the present invention.
Figure 1B:
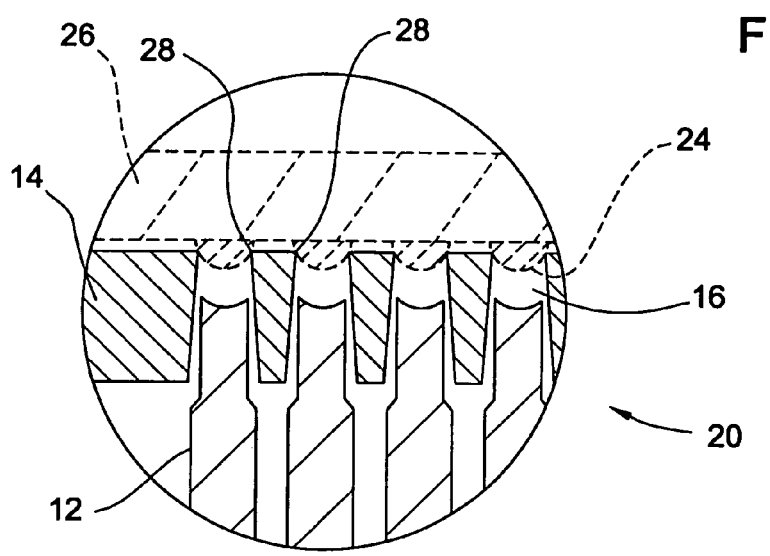
FIG. 1b is a detailed cross sectional view of the embodiment shown in FIG. 1a illustrating the apparatus in a first relative position.
Figure 1C:
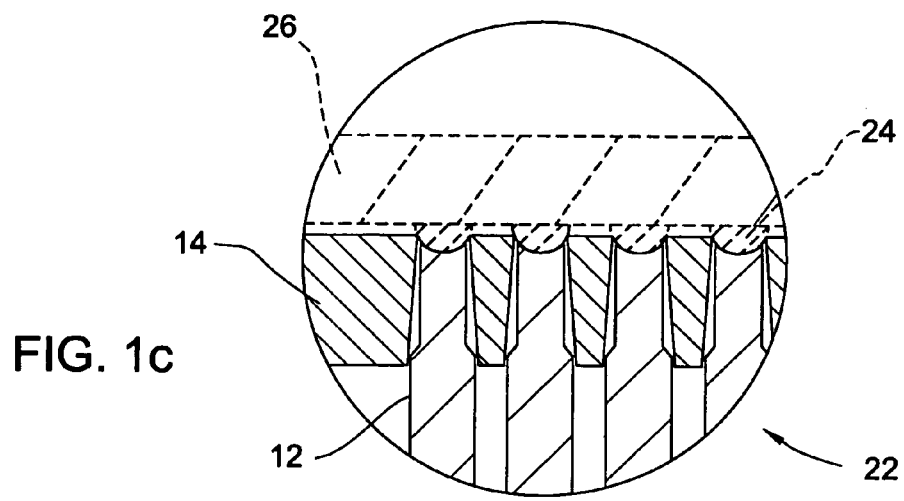
FIG. 1c is a detailed cross sectional view of the embodiment shown in FIG. 1a illustrating the apparatus in a second relative position.

FIG. 1a is a cross sectional view, and FIGS. 1b and 1c are detailed cross sectional views illustrating various embodiments of the invention. As shown, for the embodiments, an apparatus 10 may include a plurality of test pins 12, and a static dissipative layer 14 having a plurality of openings 16. A plurality of support features 18 may be coupled to the static dissipative layer 14 to movably support the static dissipative layer 14, at a first relative position 20 as illustrated in FIG. 1b, and at a second relative position 22 as illustrated in FIG. 1c. The static dissipative layer 14 may make initial contact with terminals 24 of a component 26 to be tested, at for example contact points 28, to discharge static, if any, that may be built up at the terminals 24 of the component 26 while the static dissipative layer 14 is supported at the first relative position 20, FIG. 1b. The support features 18 may also enable the static dissipative layer 14 to expose the test pins 12 through the openings 16 to make contact with the terminals 24 of the component 26 after the static dissipative layer 14 has made initial contact with the terminals 24 of the component 26 at the first relative position 20. The plurality of openings 16 may be substantially aligned with the test pins 12 when the static dissipative layer 14 is supported at the second relative position 22, FIG. 1c. While in the second relative position 22, the test pins 12 may make contact with the terminals 24, and the component 26 may be tested.

It will be understood by one of ordinary skill in the art that while in the first relative position 20, in some embodiments according to the invention, the test pins 12 may not be aligned with the openings 16.

The component illustrated in these example embodiments is illustrated to have ball grid array (BGA) terminals 24. It will be understood by one of ordinary skill in the art that components having other terminal types may also be used. Various terminal types include land grid array (LGA) and pin grid array (PGA) and are discussed below.

The plurality of support features 18 may be designed to move the static dissipative layer 14 toward the test pins 12, or the test 12 pins may be designed to move toward the static dissipative layer 14. In various embodiments, both the static dissipative layer 14, and the test pins 12 may be designed to move.

FIG. 2a is a cross sectional view, and FIGS. 2b and 2c are detailed cross sectional views illustrating various embodiments of the invention. As shown, for the embodiments, an apparatus 110 may include a plurality of test pins 112, and a static dissipative layer 114 having a plurality of openings 116. The apparatus 110 may include a plurality of support features 118 which may be, or may include a bias 119 designed to bias one or both of the static dissipative layer 114 and the test pins 112 toward a first relative position 120, as illustrated in FIG. 2b. The bias 119 may be a spring, for example, a coil spring. In various embodiments, the bias 119 may have a bias force strong enough to support a component 126, and in other embodiments, the bias 119 may have a bias force such that the weight of the component may push the static dissipative layer 114 toward the test pins 112.

Various of the embodiments having a bias 119 strong enough to support the component 126 may further include a pushing member, illustrated schematically in FIG. 2a with an arrow 128, designed to push the static dissipative layer 114 toward the test pins 112 against the bias 119. The pushing member may be automated, or manually actuated, and may put the static dissipated layer into a second relative position 122 as illustrated in FIG. 2c.

FIG. 3 is a top view of the static dissipative layer 114 illustrated in FIG. 2a. The static dissipative layer 114 may have tabs 130 extending from opposite edges 132 thereof. For example, the static dissipative layer 114 may have a tab 130 extending from each of the four edges 132 thereof. Returning again to FIG. 2a, the apparatus 110 may further comprise a base 134 designed to hold the plurality of test pins 112. The plurality of support features 118 may include bias members 119, for example, three springs 119, disposed between each of the tabs 130, and the base 134 designed to bias the static dissipative layer 114 and the plurality of test pins 112 toward the first relative position 120 illustrated in FIG. 2b.

Various embodiments may include various numbers and placements of bias members, including no bias members. Various embodiments may provide direct interconnection and movement between the static dissipative layer 114 and the test pins 112 with, for example, gearing and/or servo motors, or the like.

Various embodiments may include a static dissipative layer 114 having a plurality of openings 116 which may be shaped as inverted frustocones. The frustoconical shape may provide good contact at one end of the openings 116 of the static dissipative layer 114 with the terminals 124 of an electrical component 126. The frustoconical shape may also provide ample clearance within the openings 116 for the test pins 112 to move unobstructed. The embodiments illustrated may include a static dissipative layer 114 with a plurality of protrusions 140 adjacent the plurality of openings 116 designed to contact the terminals 124 to dissipate a static charge, if present, from the terminals. The protrusions 140 may each include edges 142 designed to contact the respective terminals 124. The edges 142 may tend to cut through an oxidation layer, or other material, if any, that may be on the terminals 124.

Various embodiments may be constructed by forming protrusions 140 on the static dissipative layer 114 and then forming openings 116 disposed through the protrusions 140.

In various embodiments the static dissipative layer 114 may be coupled with a ground. The ground may be the ground of a test circuit designed to test the component.

FIG. 4a and FIG. 4b are detailed cross sectional views illustrating various embodiments of the invention. As shown, for the embodiments, an apparatus 210 may include a plurality of test pins 112, and a static dissipative layer 114 having a plurality of openings 116 similar to the embodiments illustrated in FIGS. 2a, 2b, and 2c. The static dissipative layer 114 may also have a plurality of protrusions 140 disposed adjacent the openings 116, and disposed to make initial contact with the terminals 224 of a device under test, or component 226. In this illustrated embodiment the component 226 may include land grid array (LGA) terminals 224. The protrusions 140 may include edges 142 as discussed and may also aid to ensure good contact between the terminals and the static dissipative layer 114.

FIG. 5 is a detailed cross sectional view illustrating various embodiments of the invention. As shown, for the embodiments, a static dissipative layer 114 may have a plurality of protrusions 140 having edges 142 that may provide good contact with terminals 324 of a device under test 326 arranged in a pin grid array (PGA).

FIG. 6 is a cross sectional view illustrating various embodiments of the invention. As shown, for the embodiments, an apparatus 410 may include a plurality of test pins 412, and a static dissipative layer 414 having a plurality of openings 416. The apparatus 410 may include a plurality of support features 418 which may be, or may include, a bias 419 and guiding features 421. The guiding features 421 may include mating surfaces and may include notches, or the like, disposed to guide and/or stabilize the static dissipative layer 414 as it moves from a first relative position 420, as illustrated in FIG. 6, or a second relative position (not shown). The bias 419 may be designed to bias one or both of the static dissipative layer 414 and the test pins 412 toward the first relative position 420. The bias 419 may be a spring, for example a coil spring, and may be located in an area where test pins are not needed. For example substantially in the center when testing a component 426 with no terminals in a center region thereof. In various embodiments, the bias 419 may have a bias force strong enough to support the component 426, and in other embodiments, the bias 419 may have a bias force such that the weight of the component may push the static dissipative layer 414 toward the test pins 412. Other features may be the same or similar to features described in relation to other embodiments described above. Other features may differ and still not depart from the invention.

Figure 7:
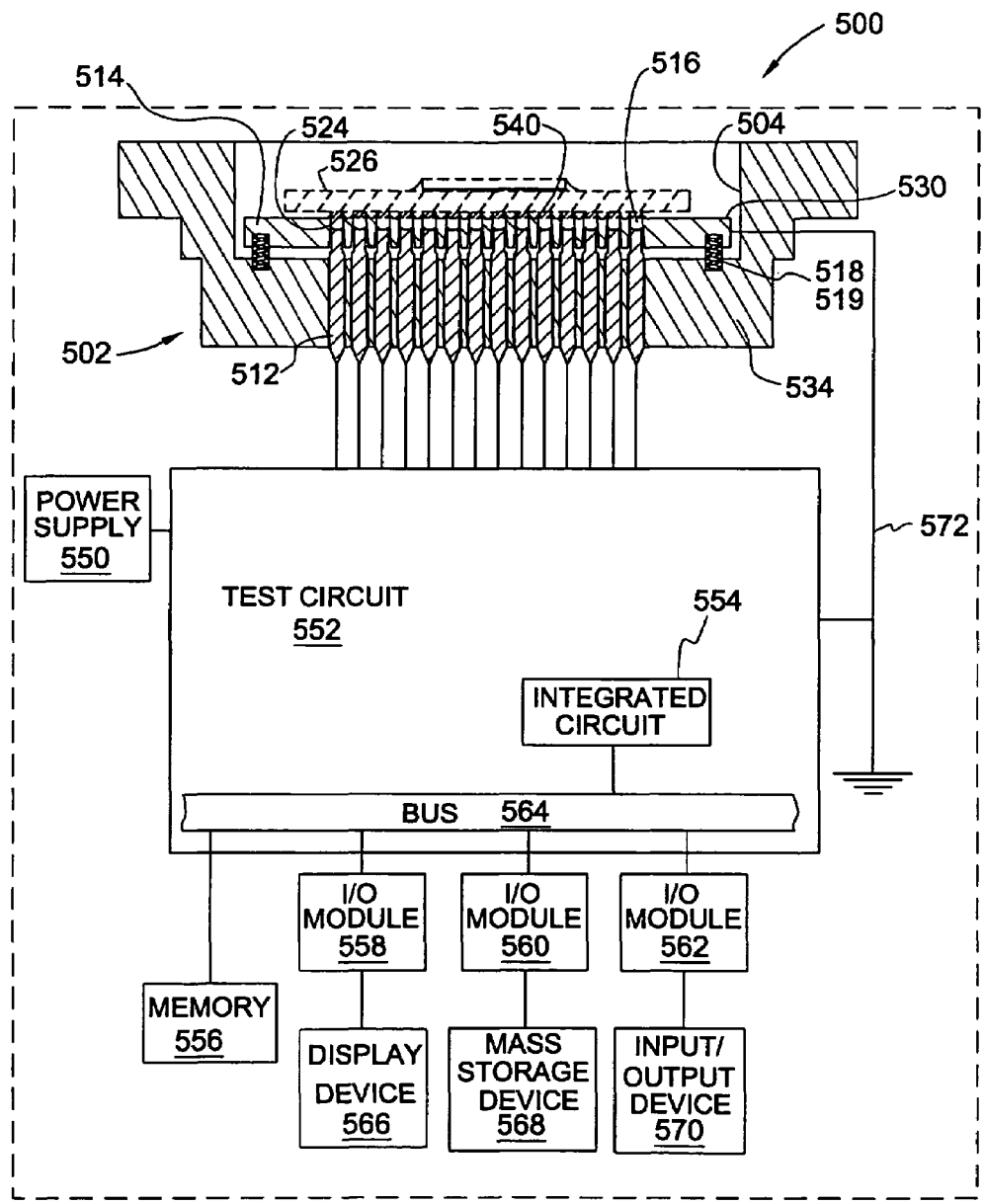
FIG. 7 illustrates a partial schematic and partial block diagram of a system in accordance with various embodiments of the present invention.

FIG. 7 illustrates a partial schematic and partial block diagram of a system 500, according to another embodiment of the invention, which is just one of many possible systems in which one or more of the earlier described test arrangements may be used. The system 500 may include one or more test arrangements as described herein or others in accordance with embodiments of the invention. This illustrated system 500 may include a tester 502 that may have a socket 504 adapted to receive a component 526 for testing. The socket 504 may have a plurality of test pins 512 at least partially housed therein. A static dissipative layer 514 may have a plurality of openings 516. A plurality of support features 518 may be coupled to the static dissipative layer 514 to movably support the static dissipative layer 514 at a first and a second relative position, to enable the static dissipative layer 514 to make initial contact with terminals 524 of the component 526 to be tested to discharge static, if any, built up at the terminals of the component while the static dissipative layer is supported at the first relative position. The support features 518 may be designed to enable the static dissipative layer 514 to expose the test pins 512 through the openings 516 to make contact with the terminals 524 of the component 526 after the static dissipative layer 514 had made initial contact with the terminals 524 of the component 526 at the first relative position. The plurality of openings 516 may be substantially aligned with the test pins 512 when the static dissipative layer 514 is supported at the second relative position. The system 500 may include a power supply unit 550 coupled to the tester 502 to provide DC power to the tester 502. The power supply unit 550 may be coupled to the tester 502 via a test circuit 552. Various other embodiments may use an AC power source. When in the second relative position the component 526 may be tested.

In this illustrated system 500, the test circuit 552 may include integrated circuit 554 which may be a processor. The test circuit may be partly or completely contained in or on a printed circuit board (PCB). The PCB may be a motherboard.

Additionally, system 500 may include a main memory 556 and one or more, for example three, input/output (I/O) modules 558, 560, and 562. These elements including the earlier described integrated circuit 554 may be coupled to each other via a bus 564. The system 500 may further include a display device 566, a mass storage device 568, and an input/output (I/O) device 570 coupled to the bus 564 via respective input/output (I/O) modules 558, 560, and 562. Examples of the memory include, but are not limited to, static random access memory (SRAM) and dynamic random access memory (DRAM). The memory may also include cache memory. Examples of the display device may include, but are not limited to, a liquid crystal display (LCD), cathode-ray tube (CRT), light-emitting diode (LED), gas plasma, or other image projection technology. Examples of the mass storage device include, but are not limited to, a hard disk drive, a compact disk (CD) drive, a digital versatile disk (DVD) drive, a floppy diskette, a tape system, and so forth. Examples of the input/output (I/O) devices may include, but are not limited to, devices which may be suitable for communication with a computer user, for example, a keyboard, a mouse, a microphone, a voice recognition device, a display, a printer, speakers, and a scanner. The system may be included within, or include, a cell phone or a personal digital assistant (PDA).

In various embodiments the system 500 may include a plurality of support features 518 which may include a bias 519 designed to bias one or both of the static dissipative layer 514 and the test pins 512 toward the first relative position.

In various embodiments the plurality of openings 516 may be inverted frustoconically shaped. The static dissipative layer 514 may have a plurality of protrusions 540 adjacent the plurality of openings 516 designed to contact the terminals 524 to dissipate a static charge, if present, from the terminals 524. The static dissipative layer 514 may include a plurality of protrusions designed to contact the terminals 524 on the component 526. The openings 516 being disposed through the plurality of protrusions 540.

In various embodiments the socket 504 may include a base 534 designed to hold the plurality of test pins 512. The static dissipative layer 514 may have tabs 530 extending from opposite edges thereof, and the plurality of support features 518 may include a bias 519 disposed between each of the tabs 530 and the base 534 biasing the static dissipative layer 514 and the plurality of test pins 512 toward the first relative position.

In various embodiments the system 500 may include a static dissipative layer 514 coupled with a ground 572 on the test circuit 552 designed to test the component 526. In various embodiments the static dissipative layer 514 may be coupled with the ground 572 via one or more support features 518, for example, via the bias 519.

Figure 8:
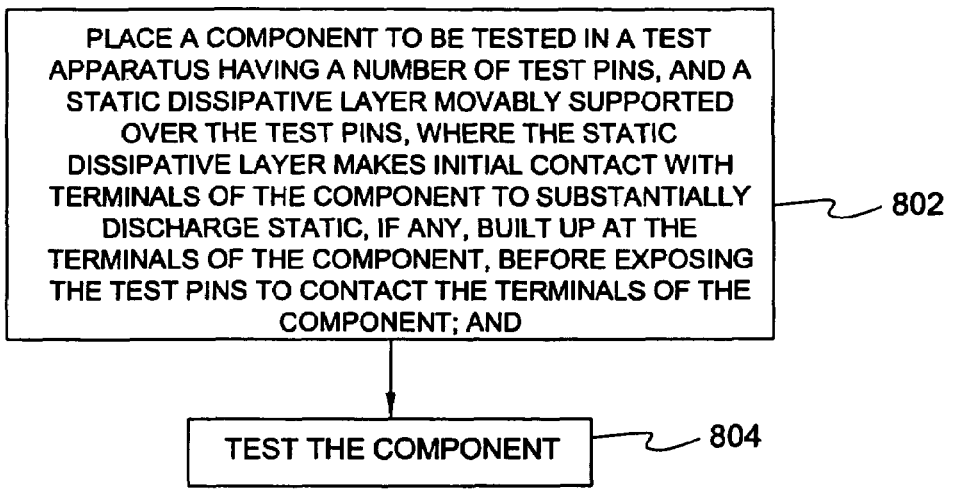
FIG. 8 is a flow diagram illustrating a method in accordance with various embodiments of the present invention.

FIG. 8 is a flow diagram illustrating a method in accordance with various embodiments of the invention. The method may include:

placing a component to be tested in a test apparatus having a number of test pins, and a static dissipative layer movably supported over the test pins, where the static dissipative layer makes initial contact with terminals of the component to substantially discharge static, if any, built up at the terminals of the component, before exposing the test pins to contact the terminals of the component, 802; and testing the component, 804.

Figure 9:
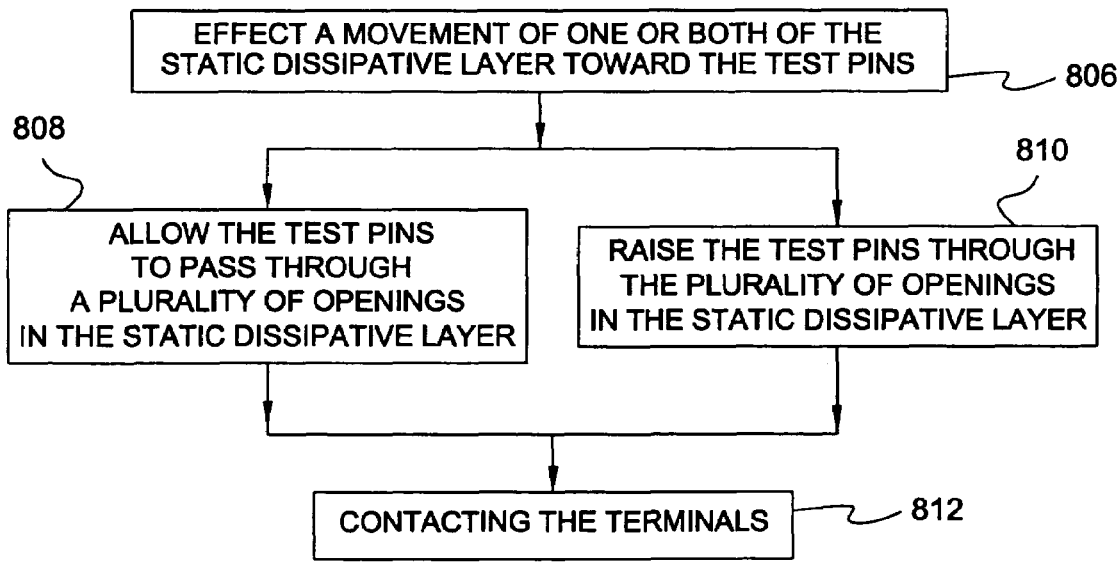
FIG. 9 is a flow diagram illustrating a method in accordance with various embodiments of the present invention.

As illustrated in FIG. 9, in various embodiments, the method illustrated in FIG. 8 may further comprise:

effecting a movement of one or both of the static dissipative layer toward the test pins 806; and allowing the test pins to pass through a plurality of openings in the static dissipative layer 808; or raising the test pins through the plurality of openings in the static dissipative layer 810; and contacting the terminals 812.

In various embodiments, the method may further comprise biasing one or both of the static dissipative layer and the test pins away from each other. In various embodiments, the method may further comprise forming a number of inverted frustoconical openings in the static dissipative layer sized to allow the test pins to pass through and contact the terminals. In various embodiments, the method may further comprise forming a number of protrusions on the static dissipative layer disposed to contact the terminals. In various embodiments, the method may further comprise coupling the static dissipative layer with a ground on a test circuit designed to test the component.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
   a plurality of test pins;
   a static dissipative layer having a top surface and a bottom surface, having a plurality of openings extending from the top surface to the bottom surface, and having a plurality of contact points located at intersections of inner walls of the plurality of openings with the top surface; and
   a plurality of support features coupled to the static dissipative layer to movably support the static dissipative layer at a first and a second relative position, to enable the contact points of the static dissipative layer to make initial contact with terminals of a component to be tested to discharge any static built up at the terminals of the component while the static dissipative layer is supported at the first relative position, and to enable the static dissipative layer to expose the test pins through the openings to make contact with the terminals of the component after the contact points of the static dissipative layer had made initial contact with the terminals of the component at the first relative position.

2. The apparatus of claim 1 wherein the plurality of openings are substantially aligned with the test pins when the static dissipative layer is supported at the second relative position.

3. The apparatus of claim 1 wherein the plurality of support features are designed to one or both of move the static dissipative layer toward the plurality of test pins or move the test pins toward the static dissipative layer.

4. The apparatus of claim 1 wherein the plurality of support features include a bias designed to bias one or both of the static dissipative layer and the plurality of test pins toward the first relative position.

5. The apparatus of claim 4 wherein the bias has a bias force strong enough to support the component.

6. The apparatus of claim 5 further comprising a pushing member designed to push the static dissipative layer toward the test pins against the bias.

7. The apparatus of claim 4 wherein the bias has a bias force such that the weight of the component pushes the static dissipative layer toward the test pins.

8. The apparatus of claim 4 wherein the bias is a spring.

9. The apparatus of claim 1 wherein the plurality of openings are inverted frustoconically shaped and have first ends at the top surface of the static dissipative layer and second ends at the bottom surface, the first ends being narrower than the second ends.

10. The apparatus of claim 1 wherein the static dissipative layer has a plurality of protrusions on the top surface adjacent the plurality of openings designed to contact the terminals to dissipate the static from the terminals.

11. The apparatus of claim 10 wherein the protrusions each include an edge designed to contact the respective terminals tending to cut through any oxide on the terminals.

12. The apparatus of claim 1 wherein the static dissipative layer includes a plurality of protrusions disposed on the top surface and designed to contact the terminals on the component, the openings being disposed through the plurality of protrusions to contact the terminals.

13. The apparatus of claim 1 further comprising a base designed to hold the plurality of test pins, and wherein the static dissipative layer has two tabs extending from opposite edges thereof, and the plurality of support features include a bias member disposed between each of the two tabs and the base biasing the static dissipative layer and the plurality of test pins toward the first relative position.

14. The apparatus of claim 1 wherein the static dissipative layer is coupled with a ground on a test circuit designed to test the component.

15. A method comprising:
   placing a component to be tested in a test apparatus having a number of test pins, and a static dissipative layer movably supported over the test pins and having a top surface and a bottom surface, where the static dissipative layer has a plurality of contact points located at intersections of inner walls of the plurality of openings with the top surface, the contact points making initial contact with terminals of the component to substantially discharge any static built up at the terminals of the component, before exposing the test pins to contact the terminals of the component; and
   testing the component.

16. The method of claim 15 further comprising effecting a movement of one or both of the static dissipative layer toward the test pins and allowing the test pins to pass through a plurality of openings in the static dissipative layer and contacting the terminals, or raising the test pins through the plurality of openings in the static dissipative layer and contacting the terminals.

17. The method of claim 15 further comprising biasing one or both of the static dissipative layer and the test pins away from each other.

18. The method of claim 15 further comprising forming a number of inverted frustoconical openings in the static dissipative layer sized to allow the test pins to pass through from the bottom surface and contact the terminals, wherein the inverted frustoconical openings have first ends at the top surface and second ends at the bottom surface, the first ends being narrower than the second ends.

19. The method of claim 15 further comprising forming a number of protrusions on the top surface of the static dissipative layer disposed to contact the terminals.

20. The method of claim 15 further comprising coupling the static dissipative layer with a ground on a test circuit designed to test the component.

21. A system comprising:
   a tester having a socket adapted to receive a component for testing, the socket having a plurality of test pins;
   a static dissipative layer having a top surface and a bottom surface, having a plurality of openings extending from the top surface to the bottom surface, and having a plurality of contact points located at intersections of inner walls of the plurality of opening with the top surface;
   a plurality of support features coupled to the static dissipative layer to movably support the static dissipative layer at a first and a second relative position, to enable the contact points of the static dissipative layer to make initial contact with terminals of a component to be tested to discharge any static built up at the terminals of the component while the static dissipative layer is supported at the first relative position, and to enable the static dissipative layer to expose the test pins through the openings to make contact with the terminals of the component after the contact points of the static dissipative layer had made initial contact with the terminals of the component at the first relative position; and
   a power supply unit coupled to the tester to provide power to the tester.

22. The system of claim 21 wherein the plurality of openings are substantially aligned with the test pins when the static dissipative layer is supported at the second relative position.

23. The system of claim 21 wherein the plurality of support features include a bias designed to bias one or both of the static dissipative layer and the plurality of test pins toward the first relative position.

24. The system of claim 23 wherein the bias has a bias force strong enough to support the component, and further comprising a pushing member designed to push the static dissipative layer toward the test pins against the bias.

25. The system of claim 21 wherein the plurality of openings are inverted frustoconically shaped and have first ends at the top surface of the static dissipative layer and second ends at the bottom surface, the first ends being narrower than the second ends.

26. The system of claim 21 wherein the static dissipative layer has a plurality of protrusions on the top surface adjacent the plurality of openings designed to contact the terminals to dissipate the static from the terminals.

27. The system of claim 21 wherein the static dissipative layer includes a plurality of protrusions on the top surface and designed to contact the terminals on the component, the openings being disposed through the plurality of protrusions to contact the terminals.

28. The system of claim 21 wherein the socket includes a base designed to hold the plurality of test pins, and wherein the static dissipative layer has two tabs extending from opposite edges thereof, and the plurality of support features include a bias member disposed between each of the two tabs and the base biasing the static dissipative layer and the plurality of test pins toward the first relative position.

29. The system of claim 21 wherein the static dissipative layer is coupled with a ground on a test circuit designed to test the component.

\* \* \* \* \*

UNITED STATES PATENT AND TRADEMARK OFFICE
CERTIFICATE OF CORRECTION

PATENT NO. : 7,522,401 B2
APPLICATION NO. : 11/441579
DATED : April 21, 2009
INVENTOR(S) : Dela Cruz et al.

It is certified that error appears in the above-identified patent and that said Letters Patent is hereby corrected as shown below:

Column 7
Line 31, "...are designed to one or both of move the..." should read --...are designed to move one or both of the...--.

Column 8
Line 52, "...the plurality of opening..." should read --...the plurality of openings...--.

Signed and Sealed this

Twenty-first Day of September, 2010

David J. Kappos
*Director of the United States Patent and Trademark Office*